US 6,614,046 B2

United States Patent
Ohno et al.

(10) Patent No.: US 6,614,046 B2
(45) Date of Patent: Sep. 2, 2003

(54) NUCLEAR SPIN CONTROL DEVICE

(75) Inventors: Hideo Ohno, Sendai (JP); Yuzo Ohno, Sendai (JP); Shuya Kishimoto, Sendai (JP)

(73) Assignee: Tohoku University, Sendai (JP)

( * ) Notice: Subject to any disclaimer, the term of this patent is extended or adjusted under 35 U.S.C. 154(b) by 40 days.

(21) Appl. No.: 09/777,366

(22) Filed: Feb. 12, 2001

(65) Prior Publication Data

US 2001/0026158 A1 Oct. 4, 2001

(30) Foreign Application Priority Data

Feb. 16, 2000 (JP) ........................................ 2000-037362

(51) Int. Cl.$^7$ ............................................. H01L 29/06
(52) U.S. Cl. ............................. 257/14; 257/257; 257/9; 257/25
(58) Field of Search ............................. 257/30, 37, 38, 257/39, 9, 12, 14, 23, 25, 183, 183.1

(56) References Cited

U.S. PATENT DOCUMENTS

| | | | |
|---|---|---|---|
| 3,626,257 A | * 12/1971 | Esaki et al. ............. | 317/234 R |
| 5,191,223 A | * 3/1993 | Munekata ................. | 257/421 |
| 5,416,353 A | * 5/1995 | Kamiguchi et al. ......... | 257/421 |
| 5,530,263 A | * 6/1996 | DiVincenzo ............... | 257/14 |
| 5,793,091 A | * 8/1998 | Devoe ....................... | 257/432 |
| 6,472,681 B1 | * 10/2002 | Kane ......................... | 257/14 |

FOREIGN PATENT DOCUMENTS

| | | | | |
|---|---|---|---|---|
| JP | 2000-68495 | * | 3/2000 | ........... H01L/29/06 |
| WO | 99/14614 | * | 3/1999 | ........... G01R/33/20 |

OTHER PUBLICATIONS

Ohno et al., "Electrical spin injection in a ferromagnetic semiconductor heterostructure," (1999), Nature 402, pp. 790–792.*

Wald et al. "Local Dynamic Nuclear Polarization Using Quantum Point Contacts," Aug. 15, 1994, Physical Review Letters, vol. 73, No. 7, pp. 1011–1014.*

Shlimak et al. reference, "Isotopically engineered silicon/silicon–germanium nanostructures as basic elements for a nuclear spin quantum computer," pp. 18–23.*

Kane, B. E., "A silicon–based nuclear spin quantum computer", *Nature*, 393, pp. 133–137.

* cited by examiner

Primary Examiner—Bradley W. Baumeister
(74) Attorney, Agent, or Firm—Oliff & Berridge, PLC

(57) ABSTRACT

A nuclear spin control device comprises a first semiconducting layer with spin-up carriers, a second semiconducting layer with spin-down carriers; and a third semiconducting layer arranged between the first and the second semiconducting layers. The third semiconducting layer can be tunnelled selectively by the spin-up carriers and the spin-down carriers such that nuclear spin in the third semiconducting layer selectively interacts with the carriers so as to be oriented into a desired direction. The device may be adapted to control the shape of a wave function so as to cover nuclear spins in the third semiconducting layer and propagate information of one nuclear spin to another nuclear spin.

4 Claims, 2 Drawing Sheets

NUCLEAR SPIN CONTROL DEVICE

BACKGROUND OF THE INVENTION

1. Field of the Invention

The present invention relates to a nuclear spin control device adapted to perform quantum-mechanic computing by controlling the spin of nucleus.

2. Description of the Related Art

Such a nuclear spin control device is utilized in a spin memory device, spin interference device, semiconductor polarizer and the like.

It is known that nuclear spin does not substantially interact with its surroundings environment and maintains a quantum mechanical state for a relatively long time. Thus, there is proposed quantum-mechanic computing by utilizing the above-mentioned property of nuclear spin to perform calculation in a relatively short time, which requires a considerably long time with existing digital computers. See, for example, B. E. Kane, "NATURE", 393, 133 (1998).

However, there exist difficulties in setting the initial state with all the nuclear spins aligned in the same direction, and controlling the interaction between the nuclear spins during the operation of the device, and such difficulties are considered to be the bottleneck in realizing quantum-mechanical computing with the nuclear spin.

DISCLOSURE OF THE INVENTION

It is an object of the present invention to provide the nuclear spin control device capable of setting the initial state with all the nuclear spins aligned in the same direction easily.

It is another object of the present invention to provide the nuclear spin control device capable of controlling the interaction between the nuclear spins easily.

According to one aspect of the present invention, there is provided a nuclear spin control device comprising:

a first semiconducting layer with spin-up carriers;

a second semiconducting layer with spin-down carriers; and a third semiconducting layer arranged between the first and the second semiconducting layers, and capable of being tunnelled selectively by the spin-up carriers and the spin-down carriers such that nuclear spin in the third semiconducting layer selectively interacts with the spin-up carriers and the spin-down carriers so as to be oriented into a desired direction.

With the above-mentioned element according to the invention, the third semiconducting layer can be tunnelled selectively by the spin-up carriers and the spin-down carriers such that nuclear spin in the third semiconducting layer selectively interacts with the spin-up carriers and the spin-down carriers so as to be oriented into a desired direction. As a result of this, it is possible to set the initial state with all the nuclear spins aligned in the same direction easily. In the description, the desired spin direction of carriers means not only "up" and "down" but also arbitrary desired direction which is realized by linear combination of both up and down states.

According to another aspect of the present invention, there is provided a nuclear spin control device comprising:

a first semiconducting layer with spin-up carriers;

a second semiconducting layer with spin-down carriers; and a third semiconducting layer arranged between the first and the second semiconducting layers, and capable of being tunnelled selectively by the spin-up carriers and the spin-down carriers;

the nuclear spin control device being adapted to control the shape of a wave function so as to cover nuclear spins in the third semiconducting layer and propagate information of one nuclear spin to another nuclear spin.

With the above-mentioned element according to the invention, the nuclear spin control device being adapted to control the shape of a wave function so as to cover nuclear spins in the third semiconducting layer and propagate information of one nuclear spin to another nuclear spin. Thereby, it is possible to control the interaction between nuclear spins easily.

The nuclear spin control device may further comprise means for applying at least one of an electric field and a magnetic field to the device so as to control the shape of the wave function of at least one of the spin-up carriers and the spin-down carriers, as well as the spin-direction of carriers in each of the first and second semiconducting layers. As a result of this, the good adjustment of the direction of the nuclear spin can be achieved.

According to another aspect of the present invention, there is provided a method of controlling a nuclear spin in a nuclear spin control device, the device comprising a first semiconducting layer, a second semiconducting layer; and a third semiconducting layer arranged between the first and the second semiconducting layers, and capable of being tunnelled selectively by spin-up carriers and spin-down carriers;

the method comprising steps of:

adjusting a carrier concentration of the first and the second semiconducting layers such that the first semiconduting layer contains the spin-up carriers and the second semiconducting layer contains the spin-down carriers under proper electric and magnetic fields; and interacting the nuclear spin in the third semiconducting layer selectively with the spin-up carriers and the spin-down carriers so as to be oriented into a desired direction.

With the above-mentioned method according to the invention, it is possible to set the initial state with all the nuclear spins aligned in the same direction easily.

Preferably, the spin direction of the carrier is adjusted by applying at least one of an electric field and a magnetic field, so that the good adjustment of the direction of the nuclear spin can be achieved.

According to another aspect of the present invention, there is provided a method of controlling a nuclear spin in a nuclear spin control device, the device comprising a first semiconducting layer, a second semiconducting layer; and a third semiconducting layer arranged between the first and the second semiconducting layers, and capable of being tunnelled selectively by spin-up carriers and spin-down carriers;

the method comprising steps of:

adjusting a carrier concentration of the first and the second semiconducting layers such that the first semiconduting layer contains the spin-up carriers and the second semiconducting layer contains the spin-down carriers under proper electric and magnetic fields; and controlling a shape of a wave function so as to cover nuclear spins in the third semiconducting layer and propagate information of one nuclear spin to another nuclear spin.

With the above-mentioned method according to the invention, it is possible to control the interaction between nuclear spins easily.

Preferably, the spin direction of the carrier is adjusted by applying at least one of an electric field and a magnetic field. More preferably, the shape of the wave function is controlled by applying at least one of an electric field and a magnetic field. Thereby, the good control of the interaction between the nuclear spins can be achieved.

BRIEF DESCRIPTION OF THE DRAWINGS

Embodiments of according to the present invention will be explained below with reference to the accompanying drawings.

DESCRIPTION OF THE PREFERRED EMBODIMENTS

Figure 1:
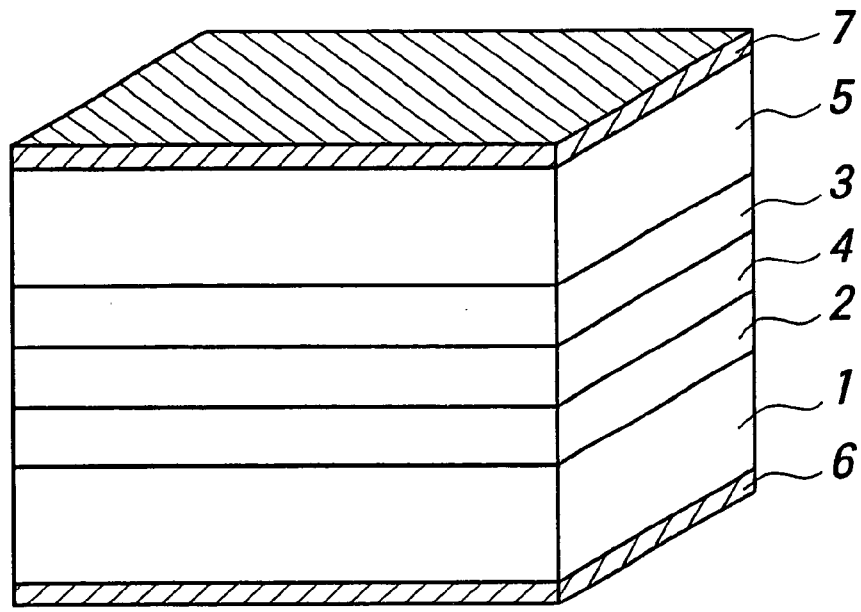
FIG. 1 is a schematic diagram showing the nuclear spin control device according to the present invention.

FIG. 1 is a schematic diagram showing the nuclear spin control device according to the present invention. The nuclear spin control device comprises a semiconducting substrate 1, a first semiconducting layer 2 provided on the substrate 1, a second semiconducting layer 3, a third semiconducting layer 4 arranged between the first and the second layers 2 and 3, a forth semiconducting layer 5 provided on the second layer 2, and electrodes 6 and 7 which sandwich the substrate 1 and the layers 2 to 5 together. In this case, the carrier concentration, or the electron and/or hole concentration of the layers 2 and 3 can be controlled by applying the voltage between the electrodes 6 and 7.

The semiconducting materials composing the substrate 1 and the layers 2 to 5 are selected so as to form a potential distribution such that carriers are confined in the layer 2 and 3. In the embodiment, the substrate 1 is composed of Si, the layer 2 is composed of SiGe, the layer 3 is composed of SiGe, the layer 4 is composed of Si doped with certain atom (e.g. P) with non-zero nuclear spin, and the layer 5 is composed of Si, respectively.

The layers 2 to 4 constitute a double quantum well structure as described later, the layers 2 and 3 form a quantum well layer, and the layer 4 form a barrier layer. In this case, the height and the thickness of the potential of the layer 4 are decided so that the carriers, or the electrons and/or the holes in the layers 2 and 3 can tunnel through the layer 4.

Figure 2:
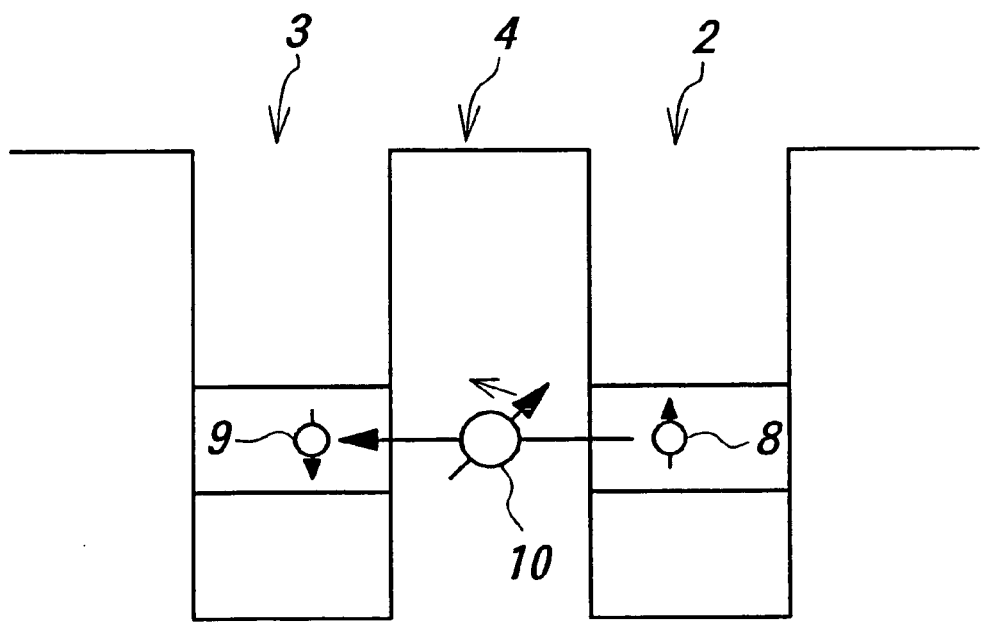
FIG. 2 is a schematic diagram showing the method of controlling the nuclear spin in the nuclear spin control device according to the present invention.

The operation of the embodiment will be described with reference to FIG. 2 in case that the electrons tunnel through the layer 4. In FIG. 2, an energy level is represented in a vertical direction, and a location of the respective layer is represented in a horizontal direction. Firstly, an electric field is generated in layers 2 and 3 by applying a certain voltage between the electrodes 6 and 7 under proper electric field and/or magnetic field, and thus the electron concentration in the respective layers 2 and 3 is adjusted at a appropriate value. In this case, as shown in FIG. 2, an electron 8 with up-spin exists in the quantum well corresponding to the layer 2, and an electron 9 with down-spin exists in the quantum well corresponding to the layer 3.

When the electron 8 or 9 tunnels through the potential layer, the electron 8 or 9 interacts with a nuclear spin 10 in the potential layer and the nuclear spin 10 is aligned with a desired direction. For example, as shown in FIG. 2, when the electron 8 with up-spin tunnels through the layer 4, the electron 8 with up-spin changes into the electron 9 with down-spin, and thus the nuclear spin 10 with up-spin appears. As a result of this, it is possible to set the initial state with all the nuclear spins aligned in the same direction easily.

Figure 3:
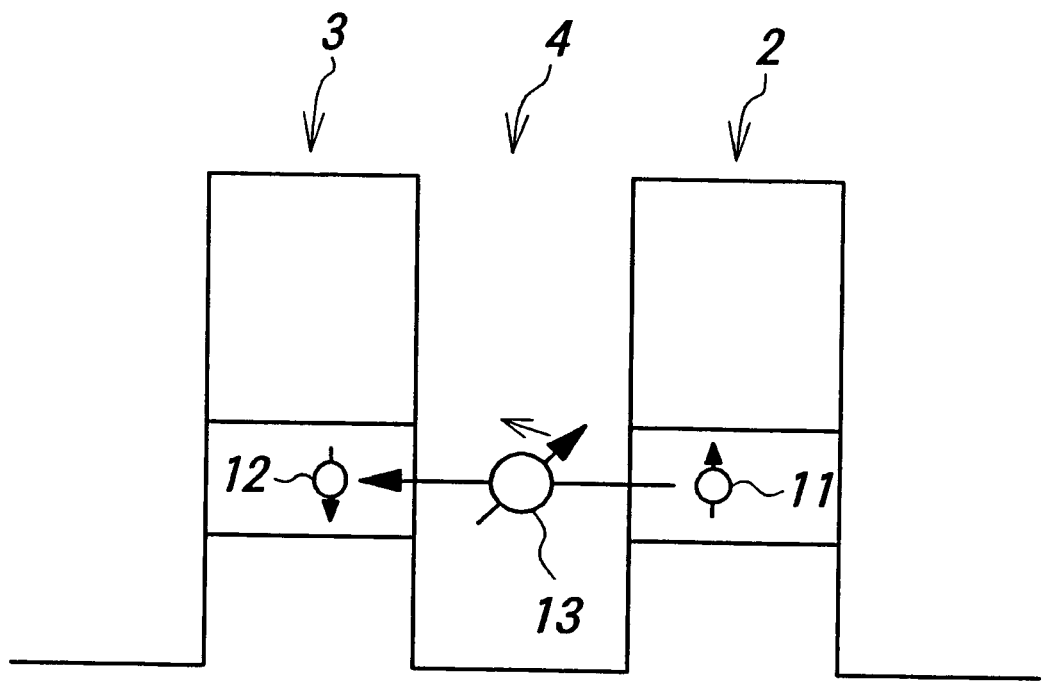
FIG. 3 is a schematic diagram showing the other method of controlling the nuclear spin in the nuclear spin control device according to the present invention.

Next, the other operation of the embodiment will be described with reference to FIG. 3 in case that the hole tunnels through the layer 4. In FIG. 3, also, an energy level is represented in a vertical direction, and a location of the respective layer is represented in a horizontal direction. Firstly, an electric field is generated in layers 2 and 3 by applying a certain voltage between the electrodes 6 and 7, and thus the hole concentration in the respective layers 2 and 3 is adjusted at a appropriate value. In this case, as shown in FIG. 3, a hole 11 with up-spin exists in the quantum well corresponding to the layer 2, and a hole 12 with down-spin exists in the quantum well corresponding to the layer 3.

When the hole 11 or 12 tunnels through the potential layer, the hole 11 or 12 interacts with a nuclear spin 13 in the potential layer and the nuclear spin 10 is aligned with a desired direction. For example, as shown in FIG. 3, when the hole 11 tunnels through the layer 4, the hole 11 with up-spin changes into the hole 12 with down-spin, and thus the nuclear spin 13 with up-spin appears. As a result of this, it is possible to set the initial state with all the nuclear spins aligned in the same direction easily.

While the present invention has been described above with reference to certain preferred embodiments, it should be noted that it were presented by way of examples only and various changes and/or modifications may be made without departing from the scope of the invention. For example, in the above-mentioned embodiment, the device has the double quantum well structure, however, the device may have any other type of a quantum confinement structure such as a multiple quantum well structure. The multiple quantum well structure may have any one of one dimension, two dimensions and three dimensions.

The substrate 1 and the layers 2 to 5 may be composed of any other material, respectively. For example, the substrate 1 is composed of (Al, Ga) As, the layer 2 is composed of GaAs, the layer 3 is composed of GaAs, the layer 4 is composed of (Al, Ga) As, and the layer 5 is composed of (Al, Ga) As. In this case, the layer 4 comprises an atom having a nuclear spin to be adjusted.

In FIGS. 2 and 3, the spin-up carrier changes into the spin-down carrier, however, it is possible to change from the spin-down carrier into the spin-up carrier. It is also possible to change the spin direction of carriers from an arbitrary desired one to another; both of which are realized by linear combination of both up and down states. In the embodiment, the spin direction is adjusted by applying an electric field, however, it can be adjusted by applying a magnetic field or both an electric field and a magnetic field.

Moreover, it is possible to adjust the carrier concentration of the first and the second semiconducting layers such that the first semiconducting layer contains the spin-up carrier and the second semiconducting layer contains the spin-down carrier, and control a shape of a wave function so as to cover nuclear spins in the third semiconducting layer and propagate information of one nuclear spin to another nuclear spin. In this case, it is preferable to adjust the spin direction of the carrier and control the shape of the wave function by applying at least one of the electric field and the magnetic field.

What is claimed is:

1. A nuclear spin control device comprising:

spin-up carriers and spin-down carriers;

a first semiconducting layer prepared to possess the spin-up carriers;

a second semiconducting layer prepared to possess the spin-down carriers; and a third semiconducting layer arranged between the first and the second semiconducting layers, and capable of being tunnelled selectively by said spin-up carriers and said spin-down carriers such that nuclear spin in said third semiconducting layer selectively interacts with said spin-up carriers and said spin-down carriers so as to be oriented into a desired direction.

2. The device according to claim 1, further comprising means for applying at least one of an electric field and a magnetic field to the device so as to control the spin-direction of carriers in each of the first and second semiconducting layers.

3. A nuclear spin control device comprising:

spin-up carriers and spin-down carriers;

a first semiconducting layer prepared to possess the spin-up carriers;

a second semiconducting layer prepared to possess the spin-down carriers; and a third semiconducting layer arranged between the first and the second semiconducting layers, and capable of being tunnelled selectively by said spin-up carriers and said spin-down carriers;

said nuclear spin control device being adapted to control the shape of a wave function so as to cover nuclear spins in said third semiconducting layer and propagate information of one nuclear spin to another nuclear spin.

4. The device according to claim 3, further comprising means for applying at least one of an electric field and a magnetic field to the device so as to control the shape of the wave function of at least one of said spin-up carriers and said spin-down carriers, as well as the spin-direction of carriers in each of the first and second semiconducting layers.

* * * * *